(12) United States Patent
Eastmond et al.

(10) Patent No.: US 6,222,880 B1
(45) Date of Patent: *Apr. 24, 2001

(54) DATA TRANSMISSION TERMINAL AND CONTACTLESS DATA/POWER DELIVERY METHOD FOR USE THEREWITH

(75) Inventors: Bruce Charles Eastmond, Downers Grove; Richard Stanley Rachwalski, Lemont; Rachid Alameh, Schaumburg, all of IL (US)

(73) Assignee: Motorola, Inc., Schaumburg, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/940,537

(22) Filed: Sep. 30, 1997

(51) Int. Cl.$^7$ .............................. H03K 7/04; H04L 27/04

(52) U.S. Cl. ........................................... 375/239; 375/310

(58) Field of Search ..................................... 375/339, 338, 375/239, 259, 295, 316, 309, 310, 311, 312; 329/313; 370/205; 340/825.58, 825.77, 825.69

(56) References Cited

U.S. PATENT DOCUMENTS 5,633,742 * 5/1997 Shipley ................................. 375/239

OTHER PUBLICATIONS

ISO/IECJTCI/SC17/WG8/TG3 N042 Minutes of the 3$^{rd}$ Meeting of WG8 Task Force 3, Vicinity Cards Oct 2$^{nd}$ and 3$^{rd}$, 1997 pp. 1–8.
ISO IECJTCI/SC17/WG8/TF3 N057 Rf Air Interface Proposal ISO 15693/Part 2 1998 pp.1–11.
ISO/IEC JTC1/SC17/WG8/TF3 N063 Minutes of the 4$^{th}$ Meeting of WG8 Task Force 3, Vicinity Cards Feb. 5$^{th}$ and 6$^{th}$, 1998 pp. 1–7.
Philips RF Air Interface Proposal ISO 15693/Part 2 pp. 1–11.
ISO/IEC JTC1/SC17/WG8 N078 ISO/IEC 15693-2 Jun. 15, 1998 pp. i–iv; pp. 1–5.
ISO/IEC JTC1/SC17/EG8/TF3 N096 Minutes of the 6$^{th}$ Meeting of WG8 Task Force 3, Vicinity Cards Jun. 22$^{nd}$ and 23$^{rd}$, 1998, pp. 1–6.
ISO/IEC JTC1/SC17/WG8/TF3 N0095 ISO/IEC 15693-2 Identification Cards–Contactless Integrated Circuit(s) Cards–Vicinity 1998 pp. i–iv; pp.1–6.
ISO/IEC JTC/SC17/WG8/TF3N107 Minutes of the 7$^{th}$ Meeting of WG8 Task Force 3, Vicinity Cards Oct. 15$^{th}$ and 16$^{th}$, 1998 pp.1–5.
ISO/IEC CD 15693-2 ISO/JTC1/SC17/WG8/TF3 N0105 Identification Cards–Contactless Integrated Circuits(s) Cards–Vicinity Integrated Circuit Card Part 2: Radio Frequency Power and Signal Interface Oct. 16$^{th}$, 1998 pp i–iii; pp.4–17.

(List continued on next page.)

Primary Examiner—Tesfaldet Bocure
(74) Attorney, Agent, or Firm—Terri S. Hughes; Cyrus Khosravi

(57) ABSTRACT

A data transmission system (200) includes a data transmission terminal (201) and a portable data device (203) that is remotely powered by the terminal. A method is provided for supplying power and data from the terminal (201) to the portable data device (203) using a carrier signal (401), including the step of identifying a slot location into which a modulation discontinuity (403–409) is introduced. The slot location is chosen within a modulation frame, which is based on n bits of the information signal to be transmitted, the number of slots in the frame varying between 1 and $2^n$. The modulation discontinuity (403–409) is introduced into the chosen slot location to produce an encoded data stream, which is then transmitted to the portable data device.

37 Claims, 4 Drawing Sheets

OTHER PUBLICATIONS

ISO/IEC Final Committee Draft 15693–2 Identification Cards–Contactless Integrated Circuits(s) Cards–Vicinity Cards Part 2: Radio Sep. 13th, 1999 pp. i–iv; pp. 1–12.

ISO/IEC JTC 1/SC 17/WG8 ISO/IEC FDIS 15693–2:1999 (E) Identification Cards–Contactless Integrated Circuit(s) Cards–Vicinity Cards Part 2: Interface Oct. 20th, 1999 pp. 1–18.

* cited by examiner

FIG. 1
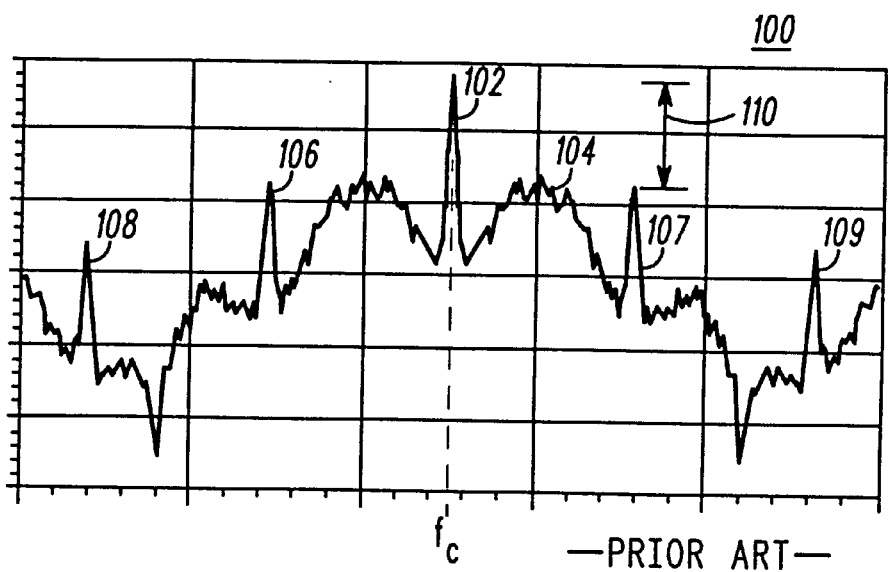
—PRIOR ART—
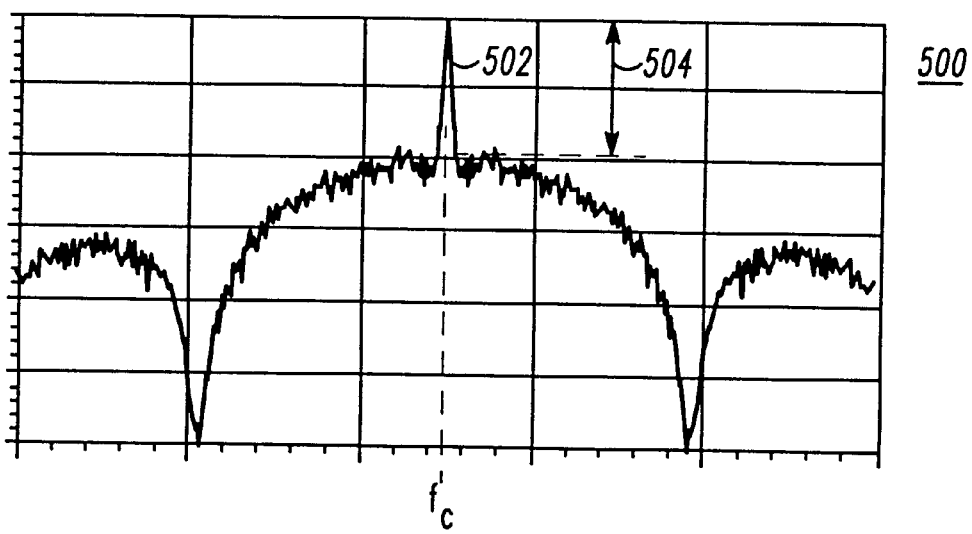
FIG. 5

FIG. 3
215

| NUMBER OF SLOTS Q | INFORMATION BIT(S) ENCODED/SLOT N | INFORMATION BIT PATTERN | SLOT LOCATION OF MODULATION DISCONTINUITY | | | | | | | | | | | | | | | |
|---|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 13 | 14 | 15 | 16 |
| 2 | 1 | 0 | x | | | | | | | | | | | | | | | |
| | | 1 | | x | | | | | | | | | | | | | | |
| 4 | 2 | 00 | x | | | | | | | | | | | | | | | |
| | | 01 | | x | | | | | | | | | | | | | | |
| | | 10 | | | x | | | | | | | | | | | | | |
| | | 11 | | | | x | | | | | | | | | | | | |
| 8 | 3 | 000 | x | | | | | | | | | | | | | | | |
| | | 001 | | x | | | | | | | | | | | | | | |
| | | 010 | | | x | | | | | | | | | | | | | |
| | | 011 | | | | x | | | | | | | | | | | | |
| | | 100 | | | | | x | | | | | | | | | | | |
| | | 101 | | | | | | x | | | | | | | | | | |
| | | 110 | | | | | | | x | | | | | | | | | |
| | | 111 | | | | | | | | x | | | | | | | | |
| 16 | 4 | 0000 | x | | | | | | | | | | | | | | | |
| | | 0001 | | x | | | | | | | | | | | | | | |
| | | 0010 | | | x | | | | | | | | | | | | | |
| | | 0011 | | | | x | | | | | | | | | | | | |
| | | 0100 | | | | | x | | | | | | | | | | | |
| | | 0101 | | | | | | x | | | | | | | | | | |
| | | 0110 | | | | | | | x | | | | | | | | | |
| | | 0111 | | | | | | | | x | | | | | | | | |
| | | 1000 | | | | | | | | | x | | | | | | | |
| | | 1001 | | | | | | | | | | x | | | | | | |
| | | 1010 | | | | | | | | | | | x | | | | | |
| | | 1011 | | | | | | | | | | | | x | | | | |
| | | 1100 | | | | | | | | | | | | | x | | | |
| | | 1101 | | | | | | | | | | | | | | x | | |
| | | 1110 | | | | | | | | | | | | | | | x | |
| | | 1111 | | | | | | | | | | | | | | | | x |

DATA TRANSMISSION TERMINAL AND CONTACTLESS DATA/POWER DELIVERY METHOD FOR USE THEREWITH

FIELD OF THE INVENTION

The present invention relates generally to data transmission systems, and more particularly to terminals and methods for use in a contactless mode thereof.

BACKGROUND OF THE INVENTION

Data transmission systems are known and are used to exchange information and conduct transactions with remotely positioned portable data devices. Such portable data devices are commonly referred to as cards, smartcards, or, in a simplified embodiment, tags. Likewise, data transmission terminals are commonly referred to as exciters or card readers. In such a data transmission system, a transaction begins when a card enters the excitation field of the terminal/reader. In particular, the terminal produces a power signal as well as a data signal (referred to as an information signal), and transmits this information signal using a carrier signal. It is the detection and reception of this carrier signal that remotely powers the card, and enables the card circuitry to perform its intended function.

It is well known that remotely powered (i.e., contactless) data devices (i.e., cards) can be used to perform a variety of tasks, including theft prevention, personnel or material identification and control, automatic fare collection, money and service transaction recording and control, and the like. While identification tags may be less complex, so-called "smartcards" tend to be more complex and may include one or more processors, as well as local memory to store and process information. Accordingly, the carrier signal transmitted by the terminal must be modulated to transfer data from the reader to the card, and detected to provide a source of power for the active circuits.

To meet the requirements of today's smartcard applications, the modulation applied to the signal sent from the reader to the card should have minimal modulation sideband spectral content, contain a DC component of high and consistent value, and be detectable with minimal card complexity. Several approaches used to date, as next described, fail to meet these basic requirements in one or more regards.

One example of such a modulation scheme is the pulse width modulation (PWM) system disclosed in U.S. Pat. No. 5,345,231 assigned to Mikron Gesellschaft for Integrierte Mikroelectronik mbH and issued Sep. 6, 1994. This system provides for the signal from the sending station (terminal) at frequency $f_0$ being pulse-width modulated according to the binary source data to be transmitted to the card. That is, a binary "0" of the source data is encoded into a burst of carrier frequency $f_0$ having time duration $t_0$, and binary "1" of the source data is encoded into a burst of carrier frequency $f_0$ having time duration $t_1$. Carrier frequency $f_0$ is absent for a predetermined time period between bursts to provide a delimiter between adjacent symbols.

A second example of the prior art is the modified Miller-encoded system used in the so-called Mifare™ product manufactured by the Philips Corporation. This system provides for the signal from the sending station (terminal) at carrier frequency $f_0$ to be modulated according to the binary source data to be transmitted to the card in the following way: a binary "0" is encoded into a symbol having the same duration as a source data bit and including a cessation in the transmission of carrier frequency $f_0$ for a predetermined time period beginning at the start of a bit; a binary "1" is encoded into a symbol having the same duration as a source data bit and including a cessation in the transmission of carrier frequency $f_0$ for a predetermined time period beginning at the middle of a bit; and the first binary "0" following a binary "1" is encoded into a symbol having a continuous transmission of carrier frequency $f_0$ for the entire duration of a source bit.

There are several problems with the prior art, including high modulation sideband emission levels, and a DC component that is diminished by discontinuous transmission and modulated significantly according to the binary source data sequence.

For illustration, FIG. 1 shows the spectrum of a signal transmitted from the terminal with a random data input and using the modified Miller approach, as described above. The spectrum shows the carrier 102, and modulation sideband components that occur at discrete frequencies 106, 107, 108, and 109, and over a continuum of frequencies 104 due to the random nature of the data input. For this modulation, the difference between the level of the carrier and the modulation sideband components is determined to be level difference 110.

The rules governing the level and structure of modulation sideband components generated by the terminals used with cards, smartcards, or tags may vary from country to country. In general, the measured radiated field strength of the modulated sideband components must lie below a set limit to meet compliance requirements in a given country. A transmitted signal containing discrete spectral components will not benefit from a reduced measured field strength level due to frequency selectivity in the measuring receiver. Thus, the power transmitted by the terminal and, in turn, the range within which the terminal and portable data device can reliably interact, may be restricted when such discrete components are present in the signal.

Further, techniques such as PWM are difficult to implement in a synchronous processing system, such as a microprocessor embodiment, since the duration of the symbol for a binary "1" is longer than the duration of the symbol for a binary "0". For these reasons, an improved data transmission terminal and contactless data/power delivery method for use therewith is required.

BRIEF DESCRIPTION OF THE DRAWINGS

FIG. 1 shows a spectral diagram of a detected excitation signal, as known in the prior art;

FIG. 3 shows a more detailed view of the modulation table shown in FIG. 2;

FIG. 5 shows a spectral diagram of a detected excitation signal, in accordance with a preferred embodiment of the present invention.

DETAILED DESCRIPTION OF A PREFERRED EMBODIMENT

The present invention encompasses a data transmission system that includes a data transmission terminal (e.g., a card reader) and a portable data device (e.g., a card) that is remotely powered by the terminal. In particular, a method is provided for supplying power and information from the terminal to the portable data device using a carrier signal. The method includes the step of identifying a slot location into which a modulation discontinuity is introduced. According to the invention, the slot location is chosen within a modulation frame that has a time duration corrsponding to n bits of the information signal to be transmitted. The number of slots in the frame varies between 1 and $2^n$. In a preferred embodiment, significant advantages can be gained when n is greater than or equal to 2, as later described. The modulation discontinuity is introduced into the chosen slot location to produce an encoded data stream corresponding with the information and power signals. Lastly, the encoded data stream is transmitted to the portable data device. In this manner, a robust power signal can be delivered to the card, while reducing the effects of modulation noise typically associated with prior art data transmission schemes.

Figure 2:
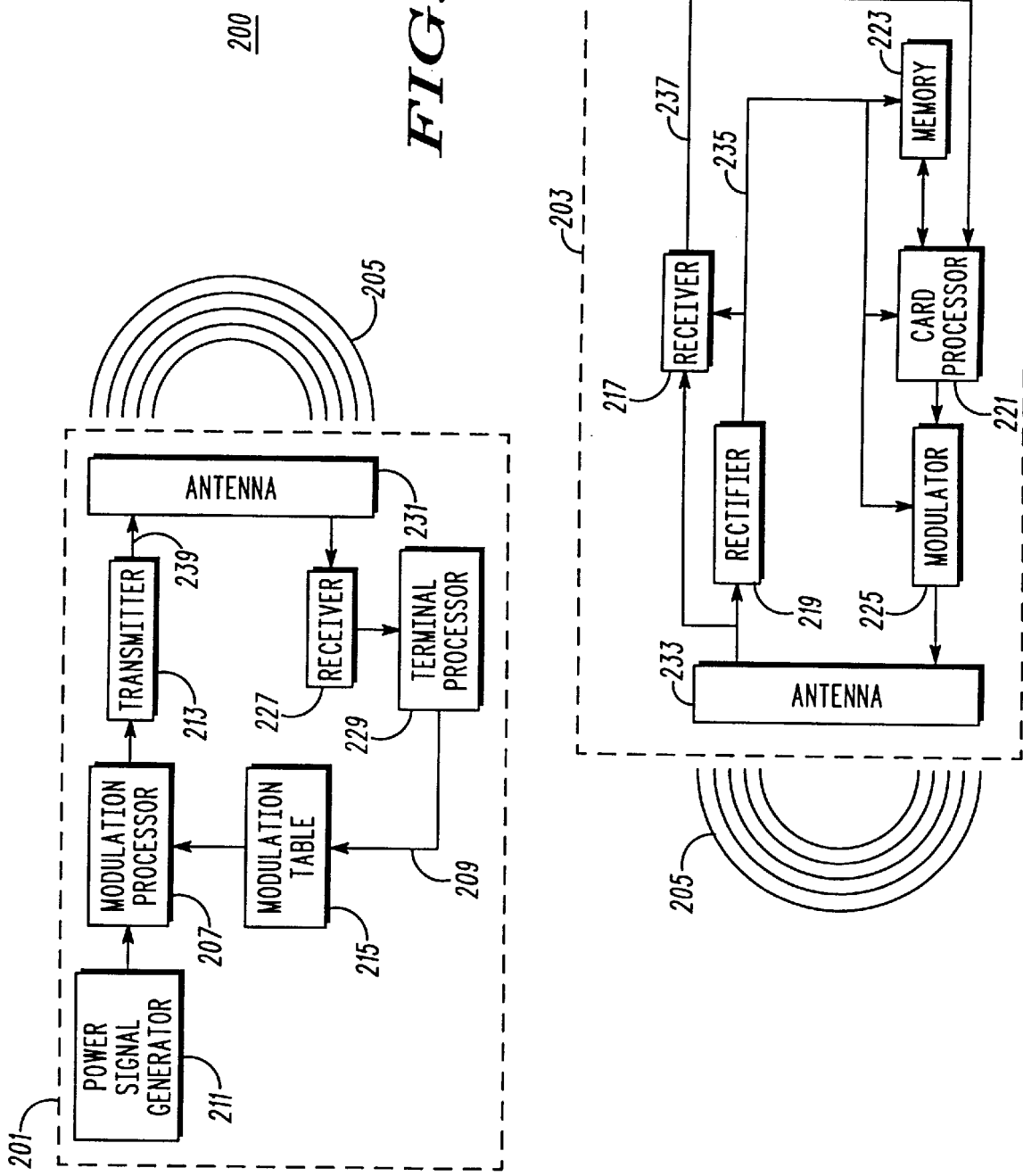
FIG. 2 shows a simplified block diagram of a data transmission system, in accordance with the present invention.

FIG. 2 shows a data transmission system 200, in accordance with the present invention, that includes a data transmission terminal 201 and a portable data device 203, between which transmissions are exchanged via coupling signal 205. Terminal 201 includes a modulation processor 207, operably coupled to a data input 209 for an information signal via a modulation table 215 and coupled to a power signal generator 211, which generates a power signal at carrier frequency $f_0$. A transmitter 213 is coupled to the output of the modulation processor 207 and generates a transmitter signal 239 that is radiated through an antenna 231. The transmitter signal contains both information and power components. Terminal processor 229 generates information signal and may receive, from a receiver 227, information that has been returned from the portable data device 203 through coupling signal 205.

The signal transmitted to the portable data device 203 is modulated using a modulation scheme according to the present invention. In the modulation scheme of the invention, an integral number, n, of information signal bits are transmitted as a group by a single modulation discontinuity located in one of $Q=2^n$ possible time slots. The modulation discontinuity, which is later described in more detail, includes change(s) in the amplitude, frequency, and/or phase of the transmitted signal. In a preferred embodiment of the invention, a modulation table 215 defines the temporal location of the modulation discontinuity. When the occurrence of each modulation discontinuity conveys more than one information bit, which occurs when $n \geq 2$, the level of out-of-band emissions is reduced and the DC component of the transmitted signal is increased for a given information signal bit rate. Moreover, since the number of modulation discontinuities conveyed for each group of n information bits is constant, the DC level of the signal at the portable data device 203 does not fluctuate with changes in the bit pattern of the information signal. Thus, a signal is generated with minimal modulation sideband emissions, and a high and consistent DC component, which ensures an efficient transfer of power to the portable data device 203.

In portable data device 203, a receiver 217 and a rectifier 219 are operably coupled to coupling signal 205 through an antenna 233. The rectifier 219 rectifies coupling signal output 205 to produce a power signal output 235, according to known prior art techniques. Power signal 235 supplies power to the receiver 217, memory 223, card processor 221 and a modulator 225, as shown. The receiver 217 receives coupling signal 205 from antenna 233 to produce a detected data signal on output 237 in which the modulator discontinuities are detected, according to detection processes known in the art. The detected data signal 237 is processed by the card processor 221 to perform the designated function for which the card is intended (e.g., id transmission, memory modification, etc.). It should be noted that card processor 221 may incorporate encryption decoding and encoding, user authentication, as well as other functions, and utilize memory 223 to store information or programs. During the time that the carrier frequency, $f_0$, is unmodulated card processor 221 may communicate with terminal 201 through modulator 225 which is coupled to the antenna 233.

FIG. 3 shows a more detailed view of the modulation table 215 shown in FIG. 2. This table shows the slot location of the modulation discontinuity associated with each permutation of data input bits, given the number of information bits, n, per modulation frame. According to the invention, the more information bits conveyed for each modulation discontinuity, the greater will be the reduction in modulation sideband emission level and the increase in the DC component. Thus, modulation schemes 302, 304, and 306 are advantageously used to provide better performance, according to the invention, as each modulation discontinuity conveys more than one data input bit. The consequence of having $n \geq 2$ is that the modulation sideband emission level is reduced and the DC component of the transmitted signal is increased. (It should be noted that modulating the data according to the scheme 301 (i.e., n=1) does not provide an advantage, as each modulation discontinuity conveys only one data input bit.)

Figure 4:
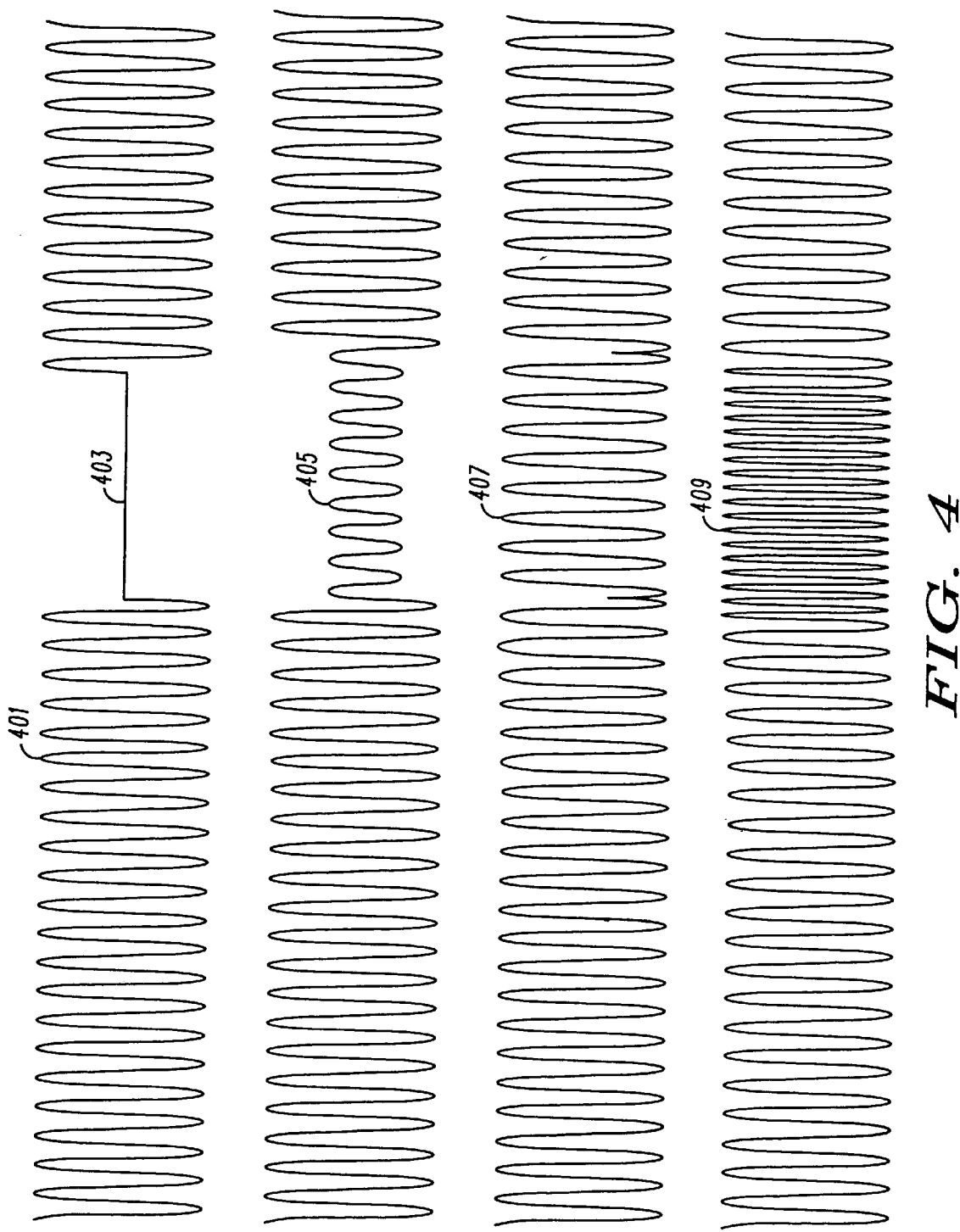
FIG. 4 shows a simplified graphical representation of a carrier signal, modulated in accordance with several embodiments of the present invention.

FIG. 4 shows examples of transmitter signal 239 versus time, including modulation discontinuities 403–409, in accordance with the present invention. This modulation discontinuity in the amplitude, frequency, or phase of carrier signal 401 defines the temporal location of the slot, as set forth in modulation table 215. For example, carrier signal 401 shows the temporal location of the sixth slot, corresponding to an information bit pattern 101, where n=3. Of course, the specific variation in amplitude, frequency, or phase modulation imposed upon carrier 401 may take many forms, which are known in the art. It is the placement of the discontinuity within the modulation frame that provides the advantages associated with the invention. As shown, carrier signal 401 may be amplitude modulated, e.g., fully interrupted during slot time 403, or a partial portion thereof (not shown), or dampened during slot time 405 as shown, or a part thereof. One of ordinary skill in the art will further recognize that the carrier signal may be phase modulated during slot time 407, or a part thereof, or frequency modulated during slot time 409, or a part thereof.

FIG. 5 shows a spectral diagram of the signal transmitted from the terminal with a random data input that is amplitude modulated with an interruption of the carrier signal for the duration of the slot (e.g., 403). In this example, n=3 and Q=8, as shown in FIG. 3, modulation table 315, in accordance with the invention. The diagram shows the carrier 502, and modulation sideband components that occur over a continuum of frequencies, due to the random nature of the data input. Modulation sideband components at discrete frequencies are effectively absent. For this modulation, the difference between the level of the carrier and the modulation sideband components is determined to be level difference 504, which is of a significantly greater magnitude than level difference 110 of the prior art. It should be noted that increasing n (and thus, Q) results in even greater performance improvement, in accordance with the invention.

A minimal-complexity data transmission terminal and contactless data/power delivery method for use therewith has been described. Such a method has been shown to dramatically increase the difference between the carrier signal and modulation sideband components by effectively eliminating undesired discrete components in the modulation sidebands. Further, the method of the invention enables a higher effective DC voltage level, with reduced fluctuation, to be derived from the terminal signal by a portable data device.

What is claimed is:

1. In a data transmission terminal for use in a data transmission system that includes a portable data device that is remotely powered by the terminal, a method of supplying a power signal and an information signal from the terminal to the portable data device via a carrier signal, the method comprising the steps of:

identifying a slot location within an n-bit modulation frame, wherein the slot location is based on n bits of the information signal and varies between 1 and $2^n$;

introducing a modulation discontinuity in the slot location to produce an encoded data stream corresponding with the information signal and the power signal; and transmitting the encoded data stream to the portable data device.

2. The method of claim 1, wherein the step of introducing comprises the step of completely interrupting the carrier signal for an interruption period.

3. The method of claim 2, wherein the interruption period spans substantially a full slot duration.

4. The method of claim 2, wherein the interruption period spans a partial slot duration.

5. The method of claim 1, wherein the step of introducing comprises the step of partially dampening the carrier signal for a dampening period.

6. The method of claim 5, wherein the dampening period spans substantially a full slot duration.

7. The method of claim 5, wherein the dampening period spans a partial slot duration.

8. The method of claim 1, wherein the step of introducing comprises the step of phase-shifting the carrier signal within the slot location.

9. The method of claim 1, wherein the step of introducing comprises the step of frequency-shifting the carrier signal within the slot location.

10. The card reader of claim 1, wherein n is greater than 2.

11. In a terminal for use in a data communication system that includes a card that is remotely powered by the terminal, a method of supplying data to the card using a carrier signal, the method comprising the steps of:

identifying a slot location within an n-bit modulation frame, wherein the slot location is based on n bits of the data and varies between 1 and $2^n$;

modulating the carrier signal during a time corresponding to the slot location to produce an encoded data stream corresponding with the data; and transmitting the encoded data stream to the card.

12. The method of claim 11, further comprising the step of supplying power to the card using the carrier signal.

13. The method of claim 11, wherein the step of modulating comprises the step of phase-shifting the carrier signal within the slot location.

14. The method of claim 11, wherein the step of modulating comprises the step of frequency-shifting the carrier signal within the slot location.

15. The method of claim 11, wherein the step of modulating comprises the step of amplitude-shifting the carrier signal within the slot location.

16. The card reader of claim 11, wherein n is greater than 2.

17. A card reader that transmits a carrier signal to a card, which carrier signal includes a data component and a power component, comprising:

modulating means for modulating the carrier signal in accordance with the power component and the data component, wherein the carrier signal is modulated during a slot location within an n-bit modulation frame, wherein the slot location is based on n bits of the data stream and varies between 1 and $2^n$; and wherein the carrier signal is interrupted within the slot location; and transmission means for transmitting the modulated carrier signal to the card for reception and use thereby.

18. The card reader of claim 17, wherein the carrier signal comprises a 13.56 MHz signal.

19. The card reader of claim 17, wherein n is greater than 2.

20. In a data transmission terminal for use in a data transmission system that includes a portable data device that is remotely powered by the terminal, a method of supplying power and information from the terminal to the portable data device via a carrier, the method comprising the steps of:

identifying a slot location within an n-bit modulation frame wherein the slot location is based on n-bits of the information and varies between 1 and $2^n$, introducing a modulation discontinuity in the slot location to produce an encoded data stream; and transmitting the encoded data stream to the portable data device.

21. The method of claim 20, wherein the step of introducing comprises the step of completely interrupting the carrier for an interruption period.

22. The method of claim 21, wherein the interruption period spans substantially a full slot duration.

23. The method of claim 21, wherein the interruption period spans a partial slot duration.

24. The method of claim 20, wherein the step of introducing comprises the step of partially dampening the carrier for a dampening period.

25. The method of claim 24 wherein the dampening period spans substantially a full slot duration.

26. The method of claim 24 wherein the dampening period spans a partial slot duration.

27. The method of claim 20, wherein the step of introducing comprises the step of phase-shifting the carrier within the slot location.

28. The method of claim 20, wherein the step of introducing comprises the step of frequency-shifting the carrier within the slot location.

29. In a terminal for use in a data communication system that includes a card that is remotely powered by the terminal, a method of supplying data to the card via a carrier, the method comprising the steps of:

identifying a slot location within an n-bit modulation frame, wherein the slot location is based on n-bits of the data and varies between 1 and $2^n$;

modulating the carrier during a time corresponding to the slot location to produce an encoded data stream; and transmitting the encoded data stream to the card.

30. The method of claim 29, further comprising the step of supplying power to the card via the carrier.

31. The method of claim 29, wherein the step of modulating comprises the step of phase-shifting the carrier within the slot location.

32. The method of claim 29, wherein the step of modulating comprises the step of frequency-shifting the carrier within the slot location.

33. The method of claim 29, wherein the step of modulating comprises the step of amplitude-shifting the carrier within the slot location.

34. A card reader that transmits a carrier to a card, which carrier includes a data component and a power component, comprising:

a modulator for modulating the carrier in accordance with the data component, wherein the carrier is modulated during a slot location within an n-bit modulation frame, wherein the slot location is based on n-bits of data and varies between 1 and $2^n$, and wherein the carrier is shifted within the slot location; and a transmitter for transmitting the modulated carrier to the card.

35. The card reader of claim 34, wherein the carrier frequency is 13.56 MHz.

36. The card reader of claim 34, wherein the card is powered by the carrier.

37. The card reader of claim 34, wherein the modulator employs one of frequency shifting, phase shifting, and amplitude shifting of the carrier within the slot location.

* * * * *